(12) United States Patent
Moldwin et al.

(10) Patent No.: US 11,921,171 B2
(45) Date of Patent: Mar. 5, 2024

(54) SPACE WEATHER MONITOR SYSTEM

(71) Applicant: THE REGENTS OF THE UNIVERSITY OF MICHIGAN, Ann Arbor, MI (US)

(72) Inventors: Mark B. Moldwin, Ann Arbor, MI (US); Lauro V. Ojeda, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 17/741,723

(22) Filed: May 11, 2022

(65) Prior Publication Data

US 2022/0365148 A1    Nov. 17, 2022

Related U.S. Application Data

(60) Provisional application No. 63/187,099, filed on May 11, 2021.

(51) Int. Cl.
*G01R 33/02* (2006.01)
*G01C 21/24* (2006.01)
*G01W 1/10* (2006.01)

(52) U.S. Cl.
CPC ......... *G01R 33/0206* (2013.01); *G01C 21/24* (2013.01); *G01W 1/10* (2013.01)

(58) Field of Classification Search
CPC .......... Y02A 90/10; G01W 1/10; G01W 1/02; G01R 29/0842; G01R 1/0408;
(Continued)

(56) References Cited

U.S. PATENT DOCUMENTS 7,285,964 B1 * 10/2007  Hsu .................. G01D 21/02
                                                              324/602
9,638,766 B2 *  5/2017  Diaconu .......... G01R 33/0017
(Continued)

FOREIGN PATENT DOCUMENTS

JP          2000180520 A  *  6/2000  ............. G01R 33/02

OTHER PUBLICATIONS

Leuzinger, A., & Taylor, A. (Feb. 2010). Magneto-Inductive Technology Overview. PNI Sensor Corporation. Retrieved Jun. 6, 2023, from https://www.unmannedsystemstechnology.com/wp-content/uploads/2020/11/White-Paper-PNI-Magneto-Inductive-Technology-Overview-r3-1.pdf. (Year: 2010).*
(Continued)

*Primary Examiner* — Daniel R Miller
*Assistant Examiner* — Eric Sebastian Von Wald
(74) *Attorney, Agent, or Firm* — Harness, Dickey & Pierce, P.L.C.

(57) ABSTRACT

A magneto-inductive DC magnetometer is provided that is operable to output fluxgate quality measurements in a low mass, volume, power and cost package. The magnetometer enables constellation-class missions not only due to its low-resource requirements, but also due to its potential for commercial integrated circuit fabrication. In addition, the magnetometer will be part of a ground-based Space Weather Underground Citizen Science instrument package that enables dense arrays of space weather-relevant observations at mid-latitudes. The magneto-inductive operating principle is based on a simple resistance-inductor (RL) circuit and involves measurement of the time it takes to charge and discharge the inductor between an upper and lower threshold by means of a Schmitt trigger oscillator. This time is proportional to the inductance that in turn is proportional to the field strength.

8 Claims, 6 Drawing Sheets

(58) Field of Classification Search
CPC .... G01R 33/0206; G01R 33/02; G01R 33/0005;
G01R 33/0041; G01R 33/0094; G01R
33/028; G01R 33/0017; G01R 33/0023;
G01R 33/022; G01R 33/0035; G01R
33/007; G01R 33/072; G01C 21/24;
G01V 3/40; G01V 3/087; G01V 3/16;
G01V 3/26; B64G 1/1021; B64G 1/105;
B64G 2001/1092; B64G 1/1085
See application file for complete search history.

(56) References Cited

U.S. PATENT DOCUMENTS

| | | | |
|---|---|---|---|
| 2013/0221951 A1* | 8/2013 | Anderson | G01R 33/007 |
| | | | 324/207.11 |
| 2017/0322303 A1* | 11/2017 | Reynolds | G01S 19/40 |
| 2021/0095966 A1* | 4/2021 | Li | G01P 15/08 |

OTHER PUBLICATIONS

Regoli, L. H., Moldwin, M. B., Pellioni, M., Bronner, B., Hite, K., Sheinker, A., and Ponder, B. M.: Investigation of a low-cost magneto-inductive magnetometer for space science applications, Geosci. Instrum. Method. Data Syst., 7, 129-142, https://doi.org/10.5194/gi-7-129-2018, 2018. (Year: 2018).*

Regoli, L., Moldwin, M., Thoma, J., Pellioni, M., & Bronner, B. (Jul. 19, 2018). Four-magnetometer board for CubeSat Applications. Small Satellite Conference. https://digitalcommons.usu.edu/smallsat/2018/all2018/270/ (Year: 2018).*

User Manual: RM3100 & RM2100. (Apr. 18, 2020). PNI: Positioning Navigation Intelligence. Retrieved Jun. 12, 2023, from https://web.archive.org/web/20200418070432/https://www.pnicorp.com/rm3100/. (Year: 2020).*

* cited by examiner

SPACE WEATHER MONITOR SYSTEM

CROSS-REFERENCE TO RELATED APPLICATIONS

This application claims the benefit of U.S. Provisional Application No. 63/187,099 filed on May 11, 2021. The entire disclosure of the above application is incorporated herein by reference.

GOVERNMENT INTEREST

This invention was made with government support under AGS1848724 awarded by the National Science Foundation. The government has certain rights in the invention.

FIELD

The present disclosure relates to weather monitoring and, more particularly, relates to a space weather monitor system.

BACKGROUND AND SUMMARY

This section provides background information related to the present disclosure which is not necessarily prior art. This section provides a general summary of the disclosure, and is not a comprehensive disclosure of its full scope or all of its features.

Space weather refers to the dynamics of the Earth's space environment due to solar disturbances that directly impact technological systems, such as satellite navigation and communication systems, power grids, and ground- and aircraft-based HF radio communication. There are significant variations in space weather effects depending on latitude, longitude, and local time, but they have not been well studied due to the sparsity of ground-based instrumentation even in relatively well instrumented areas of the globe.

The research focus of the present Space Weather Monitor (aka SWM) project is to understand small and medium-scale space weather effects primarily in the American sector (at low to auroral latitudes) by enabling dense arrays of low-cost magnetometers that are embedded into existing regional networks of space physics instrumentation, such as magnetometers, GPS receivers, radars, and all-sky cameras. In addition to providing scientific data through the SWM project, the new research-quality magnetometer system of the present disclosure enables new innovative approaches for deploying and maintaining a SWM system by significantly lowering the costs of the system and complexity of the deployment. The magnetometer of the present disclosure can also enable future commercialization (and further cost reduction) and distribution of space weather stations to citizen scientists, K12 schools, museums, and universities in the same spirit of how digital, internet-enabled weather stations have greatly expanded the geographic coverage and density of meteorological observations. A Plug-and-Play Power and Communication Observatory (3PCO) System is designed to provide opportunities for multiple low-power systems to be deployed out-of-phase to continuously expand the capabilities of each site and enable multiple investigators to share the same open-source power and communication system.

Within the context of the Space Weather research theme, SWM has two main goals directly aligned with the space physics community objectives: (1) develop low-cost instrumentation and power and communication systems to enable coverage over North America and better coverage at other locations; and (2) understand the meso and small-scale structure of geomagnetic storm and horizontal and field-aligned current signatures at mid-to-auroral altitudes.

Accordingly, in some embodiments of the present disclosure, a low-cost, low-power, self-contained, easy to deploy, research quality, SWM system 10 is provided. This system can be used to augment or replace existing magnetometer stations and arrays and provides a basis for a future commercial system that can be widely distributed among universities, K12 schools, and citizen scientist communities.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
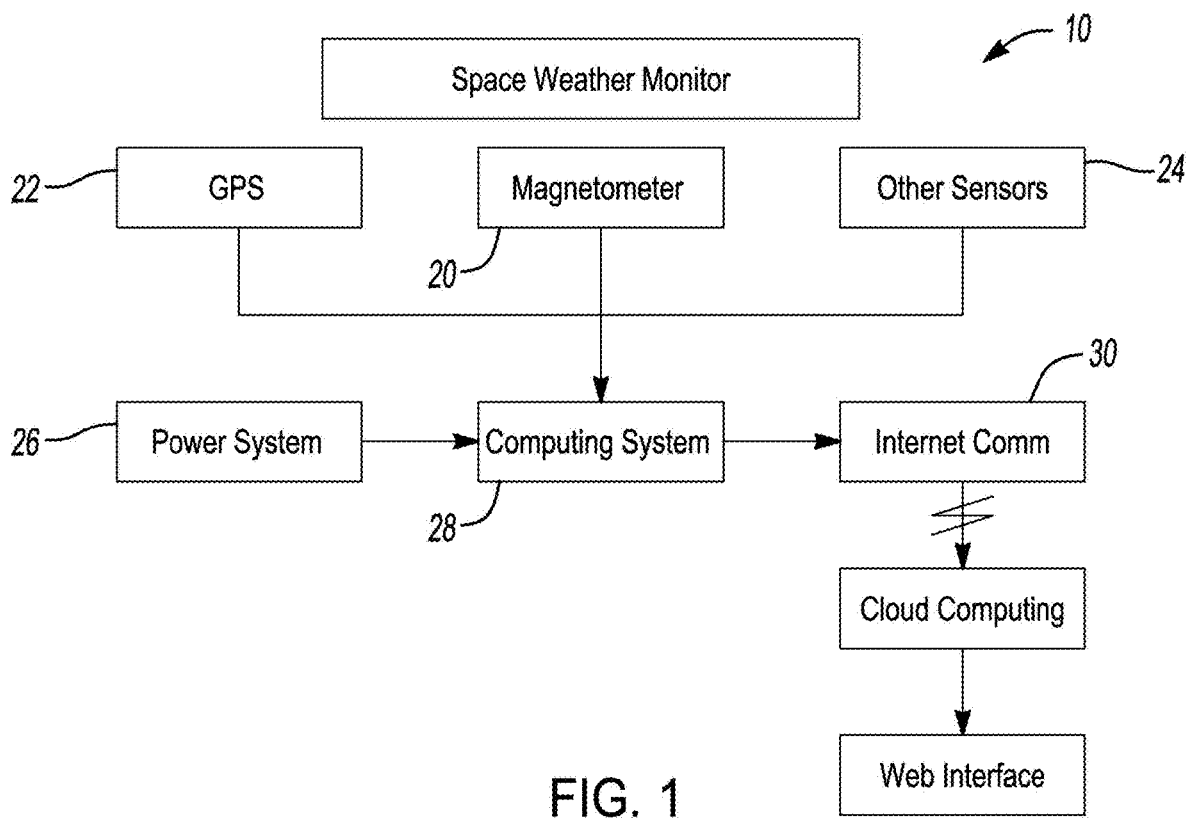
FIG. 1 is a schematic of a Space Weather Monitor (SWM) system according to the principles of the present teachings.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected, or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

According to the principles of the present teachings, a Space Weather Monitor (SWM) system 10 is provides a low-cost instrumentation, power and communication systems for monitoring and understanding the meso and small-scale structure of geomagnetic storms and horizontal and field-aligned current signatures at mid-to-auroral altitudes to enable coverage over North America and better coverage at other locations. Generally, in some embodiments, the SWM system 10 can comprise a magnetometer system 20, a GPS system 22, and other sensors 24 that are operably coupled to a power system 26, a computing system 28, and a communication system 30.

Figure 2A:
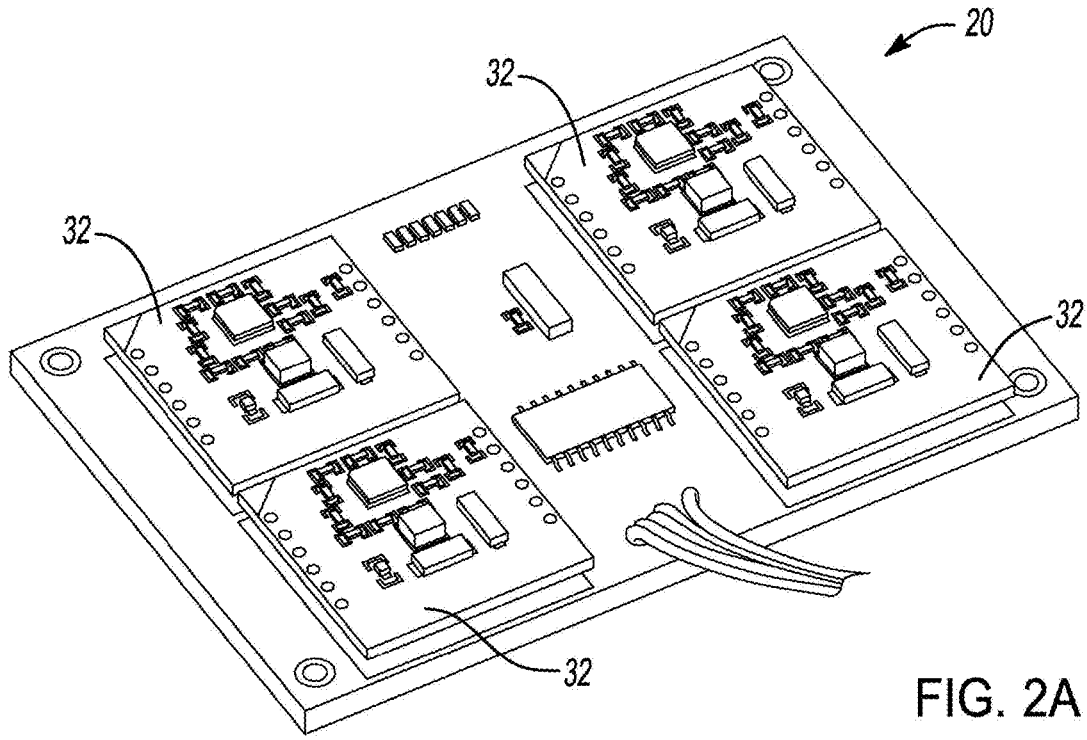
FIG. 2A is a magnetometer system of the SWM system according to the principles of the present teachings designed for a CubeSat.
Figure 2B:
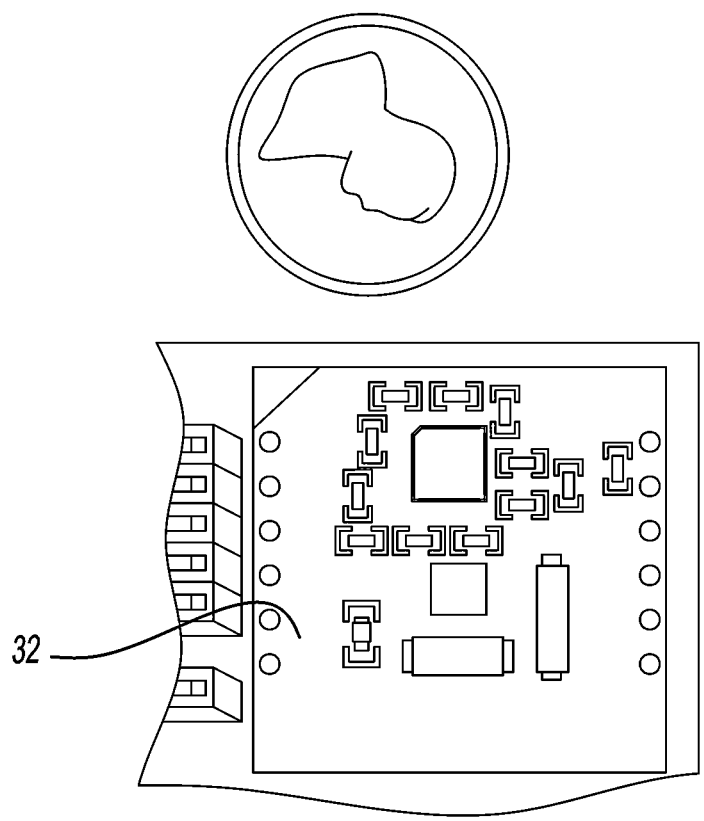
FIG. 2B is a PNI™ board adjacent to penny for size comparison.
Figure 2C:
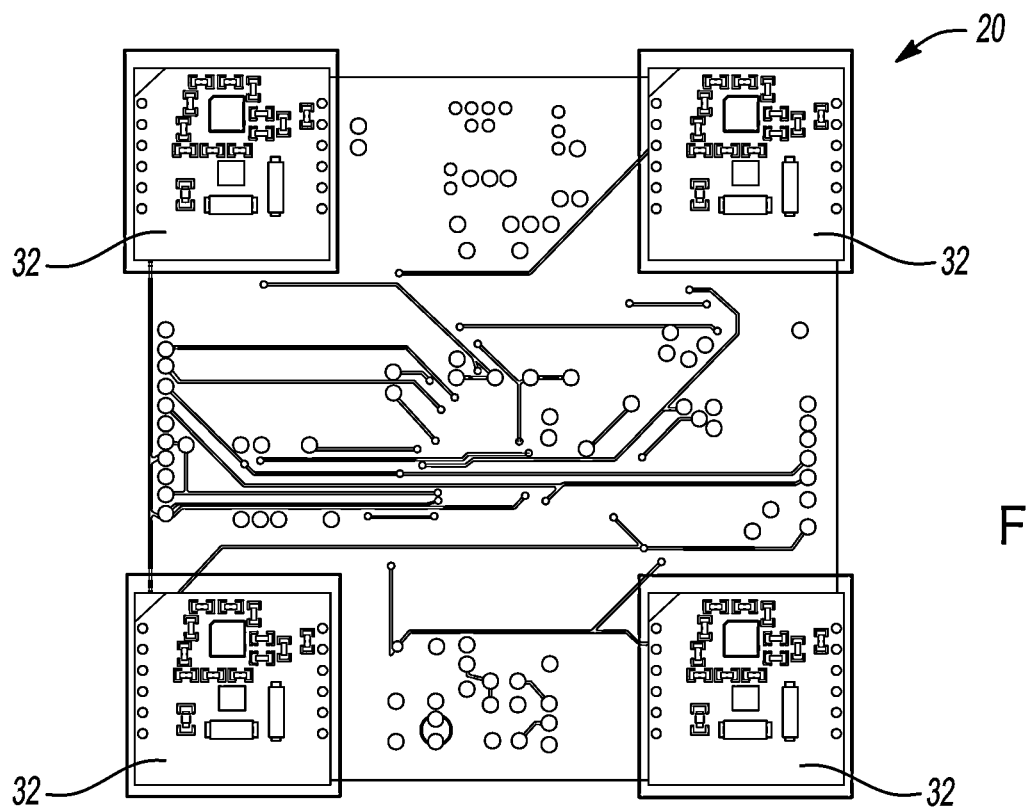
FIG. 2C is a photograph of the magnetometer system in accordance with the principles of the present teachings wherein the magnetometer system integrates four independent PNI™ RM3100 magnetometers on a single board.
Figure 2D:
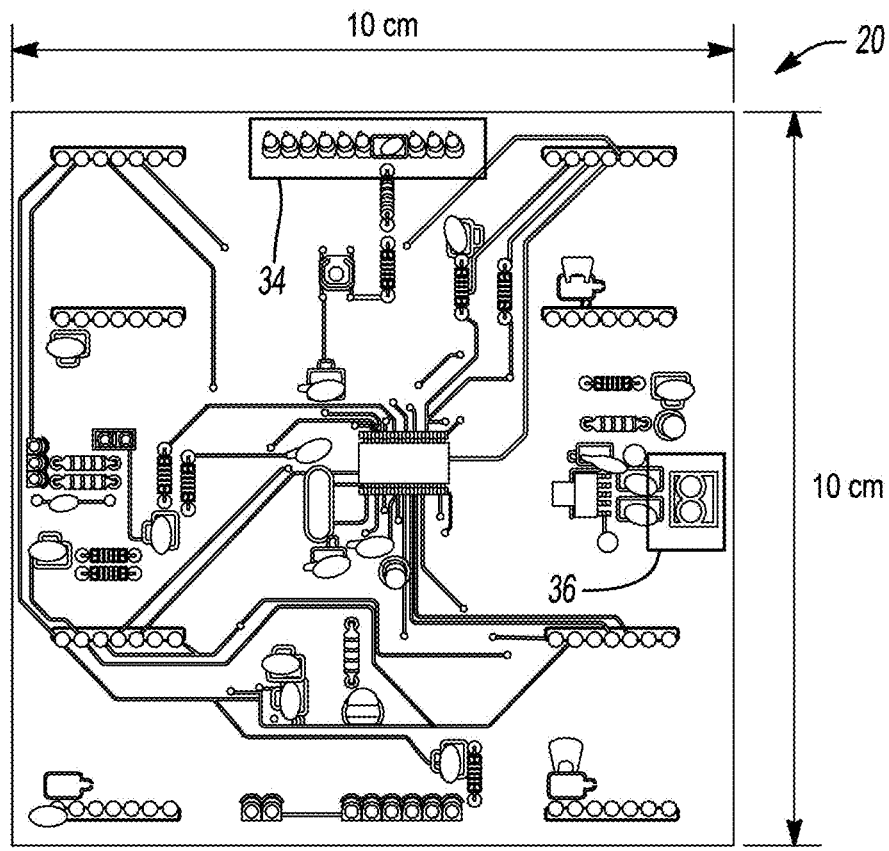
FIG. 2D is a photograph of the magnetometer system in accordance with the principles of the present teachings.

In some embodiments, as illustrated in FIGS. 2A-2D, the magnetometer system 20 can comprise or be based on a plurality of PNI™ Induction magnetometer electronics 32, as particularly illustrated in FIGS. 2A-2C. In some embodiments, magnetometer system 20 can comprise a single circuit board 34 having four (4) sensors 32 each positioned or disposed at opposing corners of the single circuit board 34 to provide both over sampling in time and double resolution. In some embodiments, magnetometer system 20 utilizes a Texas Instrument MSP430FR5949 microcontroller to synchronize sensor data and provide a flexible, streamlined command interface between a host computer and instrument. As illustrated in FIG. 2D, magnetometer system 20 can comprise a header system 34 for communication with the instrument and a power interface 36 for electrical coupling with power system 26.

Figure 2E:
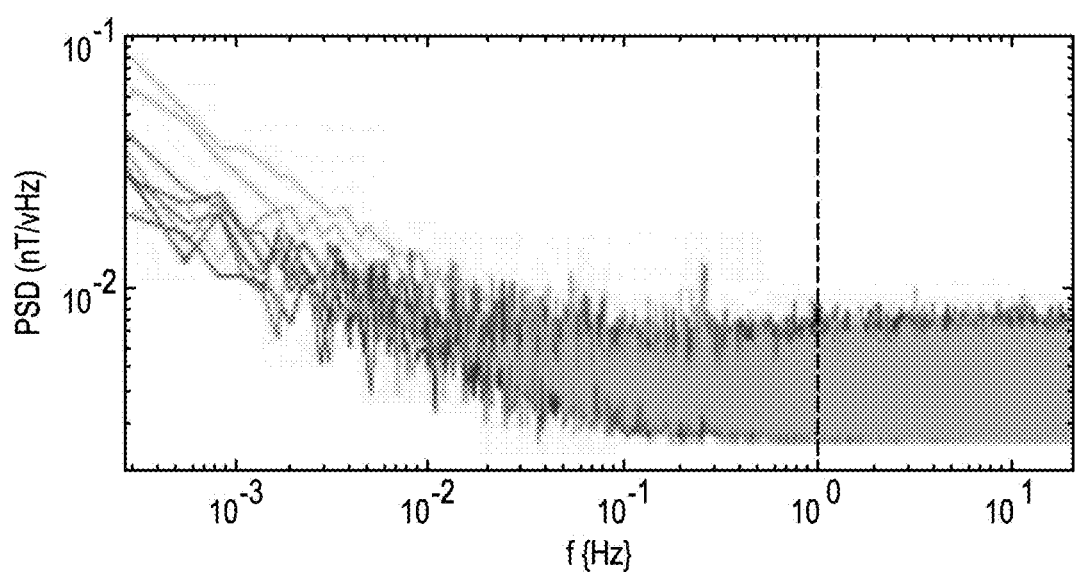
FIG. 2E is a power spectral density of signals graph with duration of 1 h. The noise density at 1 Hz (vertical dashed line) is taken as the noise floor of the instrument.

FIG. 2B is a PNI™ RM3100 board adjacent to a penny for size comparison. Performance of the PNI™ RM3100 board is illustrated in FIG. 2E as a power spectral density of signals graph having a duration of 1 h. The noise density at 1 Hz (vertical dashed line) is taken as the noise floor of the instrument. The PNI™ RM3100 magnetometers have flight heritage on CubeSat Missions (e.g., the UM RAXs mission, but they were used primarily for attitude control). The PNI™ chip was selected due to its flight heritage and that is enables modifications and exchange to the electronics and sensors to improve its performance. Prior research has demonstrated that this new modified system is very capable (2 nT resolution, noise floor of 5 pT/root (Hz) at 1 Hz with sampling rate of 40 Hz, highly linear across the full Earth's field). The magnetometer system 20 has a resolution of under 1 nT, which is of sufficient quality for ground-magnetometer studies of storms, substorms, and ULF waves. We will leverage the space-based instrument development for the new SWM system 10. As performance improves (goal of achieving 0.1 nT resolution with continued low-noise at 1 Hz), it is anticipated that new versions of the equipment are incorporated into the system.

Another feature of the magnetometer system 20 is the resolution and noise floor of the system is fairly stable up to about 10 Hz at which point the system's sensitivity degrades. This frequency would enable measurement of the full spectrum of ULF waves (from Pc 1 to 5) without needing both a DC magnetometer such as a fluxgate and a search coil magnetometer. Many Pc 1 waves are large amplitude (>1 nT) and therefore observable from the current generation of the system.

In some embodiments, the magnetometer electronics are packaged into a self-contained weatherproof enclosure 40. Because most current magnetometers have the electronics separated from the sensor by 50 to 100 meters of cable and requires a structure for power and electronics/computer protection from the environment, site selection and deployment are significant barriers to install new systems. However, the present system 10 provides a self-contained weatherproof solution that overcomes the limitations of the prior art.

The power source 20 can comprise one or more solar panels (FIG. 8), wind power generation, a battery system, and/or a standard AC power connector. The power source 20 can comprise a monitoring system configured to determine when the system has sufficient energy to operate.

The communication system 30 can comprise WiFi (as part of the Raspberry Pi), cellular, and/or new Iridium modem capabilities. In some embodiments, communication system 30 comprises an internet communication interface (WiFi, cell, satellite) that is used to upload magnetometer (or other sensors) data to a remotely located computing system (cloud computing). In some embodiments, the remote computing system is capable of organizing the sensor data facilitating user queries. In some embodiments, the remote computing system is capable of processing sensor data from multiple locations.

The GPS system 22 can provide geolocation and actual time data to data recordings. The GPS system 22 can comprise a dual frequency GPS unit used to provide geolocation, actual time, as well as other atmospheric parameters that can be observed using the dual satellite radio signals, such as Total Electron Content. In some embodiments, other sensors 24 can comprise sensors to detect temperature, humidity, barometric pressure, and the like that provide data relating to local weather conditions that can be used to further refine and correct magnetic measurements. Sensors 24 can further comprise additional inertial sensors (gyros and accelerometers) that provide dynamic information (orientation, vibration, motion) that can be used to further refine and correct the magnetic measurements.

This SWM system 10 seeks to test a new innovative approach to deployment and maintenance of magnetometer arrays. This "upkeep" is one of the community's biggest hurdles and was the subject of the NSF Community Workshop that proposed DRUMs (Diagnostics and Response Unit for Magnetometers) that called for dedicated effort across institutions to support the operation and maintenance of magnetometers. The SWM system 10, by lowering the system cost and complexity of deployment (that traditionally includes site selection, drilling holes in buildings, digging trenches for cables, burying sensors and alignment) can enable the continued operation of existing stations, rejuvenation of old systems, and expansion of magnetometer arrays. Novel pilot approaches that a <$1 K per unit system enables could include deploying two independent systems at the same site (this approach can provide increased resolution by over sampling, spurious noise detection (if signal is not seen in both detectors), and redundancy) potentially decreasing the need to visit sites and loss of data for extended periods of time. The dual-system deployment also allows rapid testing of new features (such as lightning suppression technology, new communication systems, and new sensor versions) and by deploying new systems next to existing systems for calibration, comparison, and redundancy. Most "dense" magnetometer arrays are deployed 200-300 km apart as this is the "field-of-view" of auroral current systems and latitudinal separation distance needed to detect field-line resonance signals. Standard practice usually requires detection of a signal in multiple magnetometers to clearly identify the signal as space or geophysical and most signals seen in only one instrument are considered potentially noise (due potentially to local disturbances such as cars, snowplows, etc.). However, the study by Simpson (2012) suggests that there are small-scale ionospheric electric fields that can drive transient (seconds) small (few to 10 s of km) scale ionospheric currents. These would be seen in only one "normally" spaced magnetometer and hence potentially marked as bad data. By deploying pairs of closely space magnetometers, these signals would be seen in multiple magnetometers hence giving confidence in their ionospheric origin.

The new instrument is a simple resister-inductor (RL) circuit that does not use an A/D converter or need amplifiers making it considerably lower power than traditional fluxgate magnetometer designs. The existing NASA-funded effort will develop the new sensor with a high-quality clock and new sensor cores to greatly improve the sensitivity of the modified-PNI™ sensor. The operating principle of the PNI™ sensor involves measurement of the time it takes to charge and discharge an inductor between an upper and lower threshold by means of a Schmitt trigger oscillator. This time is proportional to the inductance, which in turn is proportional to the field strength, within a specified operational range. This operation is illustrated by the functional diagram shown in FIG. 3 top, the magnetometer is an RL circuit with a Schmitt Trigger for counting pulses.

Figure 3:
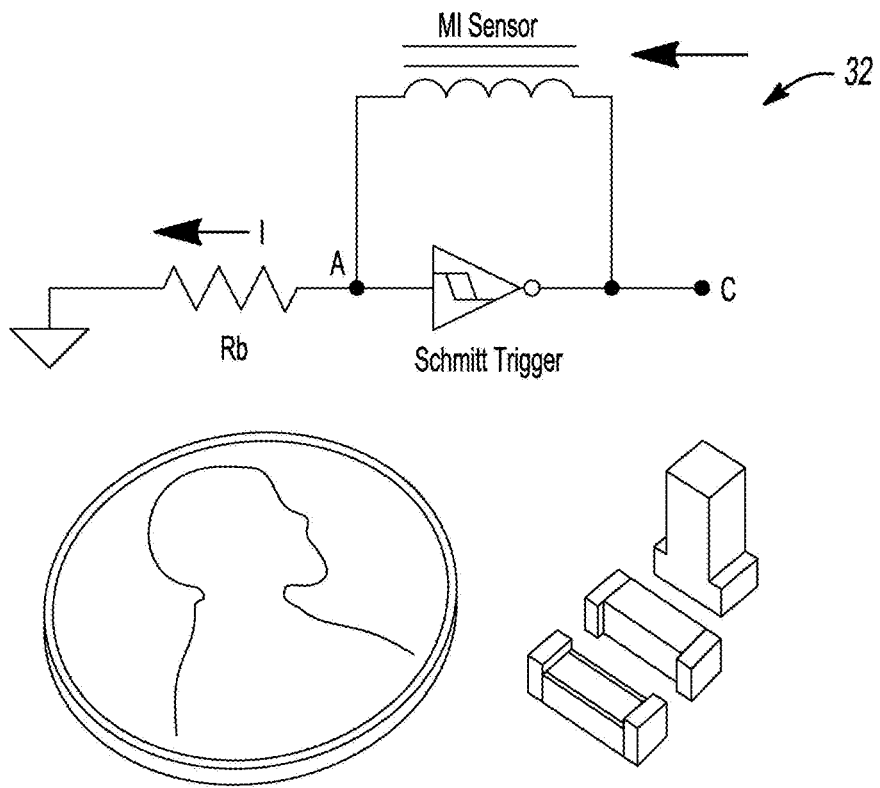
FIG. 3 is the block diagram of the PNI™ Induction 3-axis magnetometer and the sensor assembly compared to the size of a penny.

In FIG. 3, HE is the external magnetic field parallel to the coil. The total field that the sensor experiences is due to the external field and the field generated by the circuit (H=kI+HE, where k is a property of the sensor, and I is the current through the circuit). The Schmitt trigger causes the current through the circuit to oscillate as the voltage passes a set "trigger" value. The time between oscillations or trigger flips is dependent on the strength of the external field and therefore the DC field can be determined by measuring the time between flips.

Figure 4:
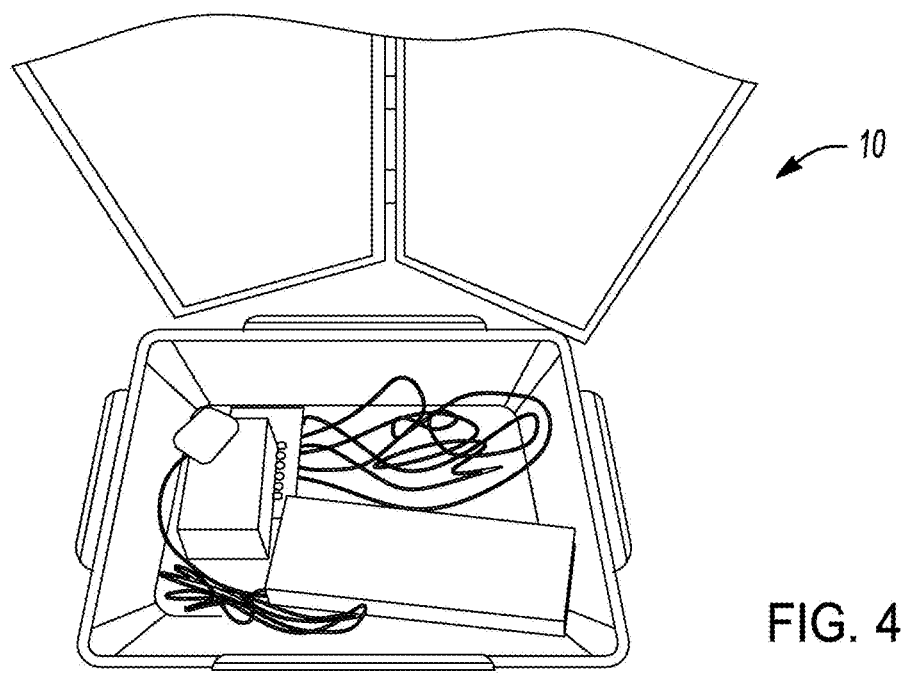
FIG. 4 is the V1.0 breadboard ground magnetometer.

To demonstrate the feasibility of the design, we have designed, fabricated, and tested a simple breadboard of the proposed new SWM system 10. This system has the magnetometer, a GPS receiver for timing, and an SD card for data storage operated by an Arduino and powered with a battery and solar panel system (FIG. 4). We have lab tested this breadboard system and magnetically characterized the different components to inform the next generation board design and placement of the power system with respect to the sensors.

Figure 5:
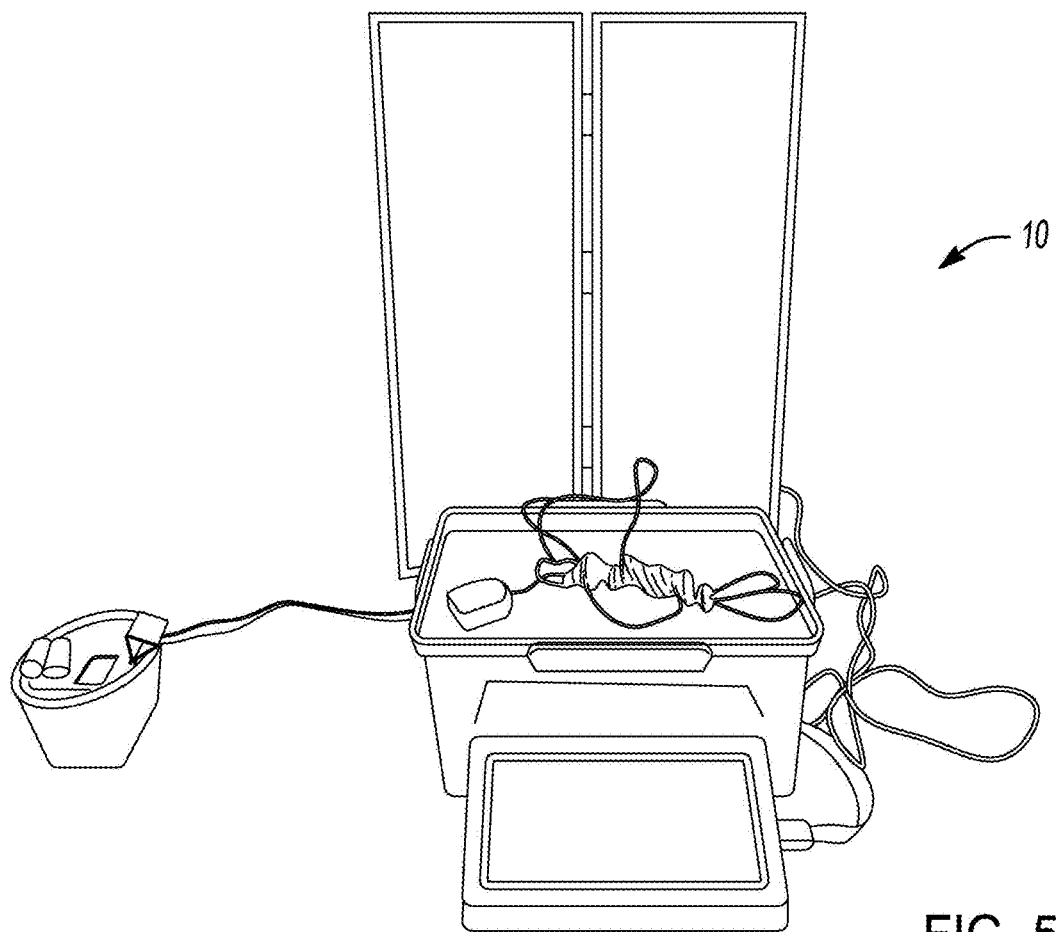
FIG. 5 is the prototype V2.0 system with magnetometer separated from control electronics and power system with Raspberry Pi controller, monitor, and keyboard system for ease of testing and deployment.

V2.0 of the system uses a Raspberry Pi for the controller to test using the WiFi capabilities with the system deployed outside. This work will provide the baseline performance for the new ground-based system in the field. Lab and field testing of thermal response of the commercial system as well as weather proofing and system deployment strategies will be tested. Recent thermal testing of the sensor from −30 deg C. to +70 deg C. found the design incredibly stable and linear over the full temperature range. However, recent thermal testing below −50 deg C. showed the introduction of noise spikes, which requires some thermal control for sensors exposed to these extreme polar temperatures. Our V1.0 Breadboard system is in a commercial weather sealed plastic box that was simply placed on the ground with the solar panel placed nearby for initial power system, data quality testing. Power cables run from the solar panel to the box, but no cables are needed to run between the sensor and the electronics (they are co-located on a PCB). Part of the design and test process will be in packaging a new printed circuit board (PCB) that has the magnetometer and GPS with the Raspberry PI. The controller has WiFi and memory built into the system to provide storage during internet connectivity disruptions. The new board system will be on the order of 10×5×4 cm and easily packaged into either a PVC pipe or a plastic electronics box. The box approach allows the use of commercial cases and easy access to battery and electronics systems. FIG. 5 shows the breadboard V2.0 with the magnetometer sensor separated by a 50 cm cable from the electronics and power box to isolate the signal from the noise. The Raspberry Pi also has various standard connectors (HDMI etc.) that enables low-cost peripherals (keyboard and monitor) to make it easy to set up and test in the field. SWM will ruggedize and weatherproof this system by placing all the electronics on a PCB, develop packaging so it fits in a standard box with the power and communication peripherals, and develop simple connectors and cabling for the solar panel and to connect to the small magnetometer box.

SWM will leverage the ongoing development of a new DC magnetometer that is based on the same measurement principles of the PNI™ induction magnetometer circuit and will have two versions. The first version has discrete high quality circuit components and a Texas Instruments MSP430 microcontroller-based sensor on a custom printed circuit board. The MSP430 family of processors are low-power, small form factor and have versions that have flown in space so operate over a wide temperature range. We also have extensive experience working with these processors. We have modeled this new sensor and demonstrated that it works in the circuit simulator SPICE and have built a bread board single axis system. The two hardware "knobs" that we can control in the design of the sensor to improve sensitivity and reduce the noise floor are the clock speed and the sensor core properties. The clock speed determines the precision of the timing of each oscillation through the hysteresis curve. The "cycle count"—the number of oscillations to be completed for a measurement—is user defined. The duration of each oscillation is dependent on the background magnetic field so measuring how long it takes to complete the cycle count can be directly converted to background field with gain proportional to total elapsed time. The first phase of the current development effort is focusing on an improved clock, which operates at substantially increased speeds, as much as 100 times faster than that of the PNI™ sensor (and hence 100 times the precision of each "count"). Another quick win with regards to sensors is to place the commercial coils (shown in FIG. 3 right bottom) in series electrically and magnetically in parallel (increases the time constant of the RL circuit that allows more counts per unit magnetic field between flips increasing sensitivity). A software "knob" that can be controlled is the cycle count of the circuit (the number of cycle counts per sample). This is the number of oscillations of the circuit per trigger flips. The more cycle counts the more resolution/precision of each "count". A faster clock allows better timing and allows an increase in cycle counts.

Figure 6:
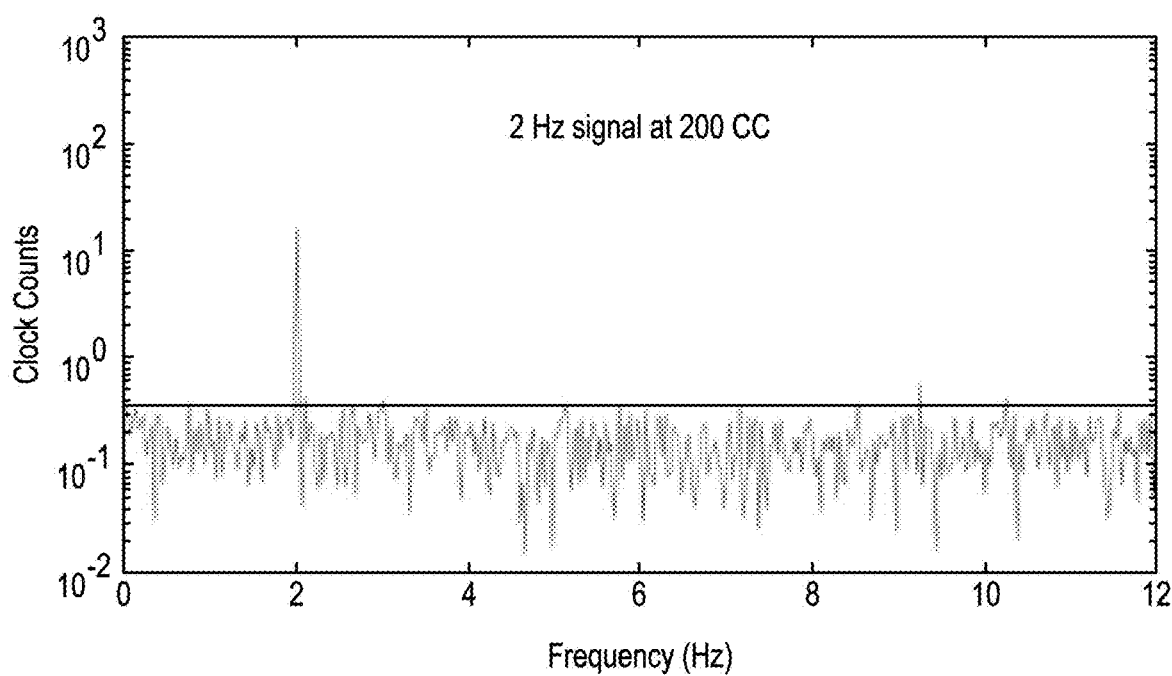
FIG. 6 is the count rate of the sensor in a low noise shield can in the magnetics lab with an applied 2 Hz signal. Note the horizontal line is at 0.3 count (log scale on vertical axis) and the frequency ranges from 0 to 12 Hz.
Figure 7:
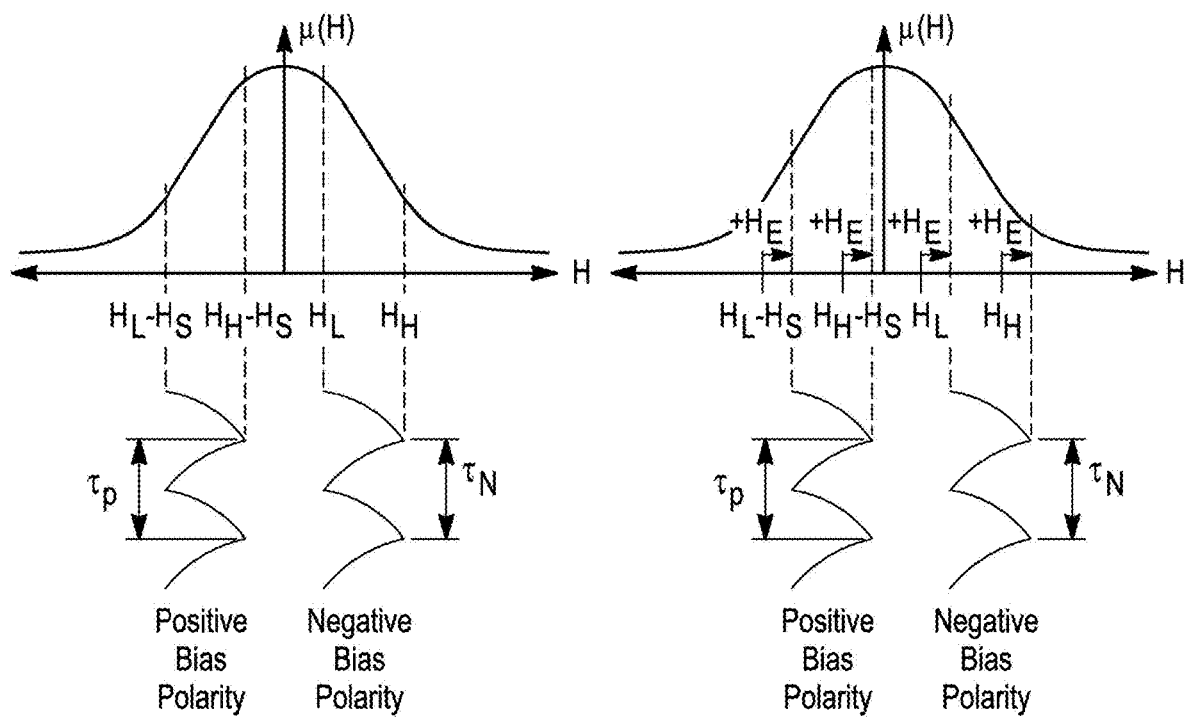
FIG. 7 is the induction in the coils as a function of applied magnetic field (top) and the traces of the oscillating current in the solenoid and the period for positive and negative bias polarity (bottom).

The preliminary bread-board system tests show that with single sensor, the noise floor is under 1 count and we have good signal to noise ratio. FIG. 6 shows a FFT power spectral density of a single axis sensor displaying counts (directly proportional to magnetic field strength by a linear gain factor) as a function of frequency with a 2 Hz signal applied and the sensor set at 200 cycle counts. The other hardware knob we will explore is testing and modeling of the commercial cores. The system depends on the senor's inductance changing with applied magnetic field along a hysteresis curve in both directions parallel and anti-parallel to the core (FIG. 7).

As the applied current oscillates the inductance of the circuit (and hence the time constant) changes. An applied field causes the crossing points on the curve to shift in the same direction on both sides of the curve, hence causing the time period of the oscillations to increase/decrease on either side/polarity. Therefore, the time to complete a fixed number of oscillations (cycle counts) are different and subtracting this difference gives you the external field. The sensor works in the non-linear portion of the hysteresis curves, and hence characterizing the core material more precisely allows higher precision and accuracy. We will develop a simple software model of non-ideal core solenoid inductance for improved understanding of sense coil parameters.

Version 3.0 of the ground-mag will use the Magnetometer system 20 design (FIGS. 2, 9, 10) with a MSP430 controller and V4.0 will begin incorporating the single UM-built magnetometers. We will conduct trade studies on the pros and cons of using the MSP430 and the Raspberry Pi. The Raspberry Pi consumes more power, but has a large user community, built in WiFi/BLE, and simple connectors (USB and serial). The MSP430 is a lower power controller, but would require more programming and interfacing to the communication system. SWM is not dependent on the success of the space-based magnetometer development path (the existing quad-board system has sufficient resolution and noise floor for the science objectives), but the project will take advantages of and leverage that effort to continuously reduce the noise and increase the resolution of the system balancing this with cost and complexity to keep the ground-based systems as cheap and reliable as possible. Other science such as studying small-amplitude ULF waves are enabled by improving the resolution. The rapid prototyping of different sensors, different communication, power, and packaging will enable rapid field testing to minimize noise, complexity and improve reliability and performance. We will use two sites for field testing. This is a magnetically quiet site. This will provide a baseline environmental noise floor for comparisons with other locations.

The Engebretsen and Zesta report on NSF ground magnetometer arrays identified a number of key issues that hinder the development of new arrays and the operation of existing arrays. These include the "custom" solutions (different magnetometers, operating systems, power and communication solutions) that each group uses, the reliability of systems (due to the magnetometer, computer, or communication infrastructure) and the cost of the system and deployments. These all contribute to arrays not operating continuously or in many cases for longer than the initial grant duration. The report recommended a DRUM approach (Diagnostics and Response Unit for Magnetometers) that funded a group to be responsible for multiple arrays across institutions and PI. One of the issues with this approach is the first issue identified above—namely many custom solutions require specific technical experience to deploy, maintain and operate. The SWM project takes a different approach by developing the power and communication infrastructure for small instruments that can be used by a variety of investigations. It features modular and scalable approach for both power and communication in a "plug-and-play" package using standard interfaces and open-source software. The 3PCO system is instrument agnostic and designed to host a variety of potential instruments (e.g., commercial GPS receivers) in addition to magnetometers. The software philosophy is similar to SuperDarn in that the code will be open source and run on standard Unix operating controllers/computers. The 3PCO operating system will operate similarly to a spacecraft flight system processor unit and will provide power, time stamping, and a flexible data interface through standard serial connectors. We have considerable experience in developing power and Iridium communication solutions for remotely deployed instruments including in Antarctica, but will design the system to be modular and standardized instead of "custom-built" for the specific site. We also will first develop a WiFi and Cellular modem solution for testing.

Figure 8:
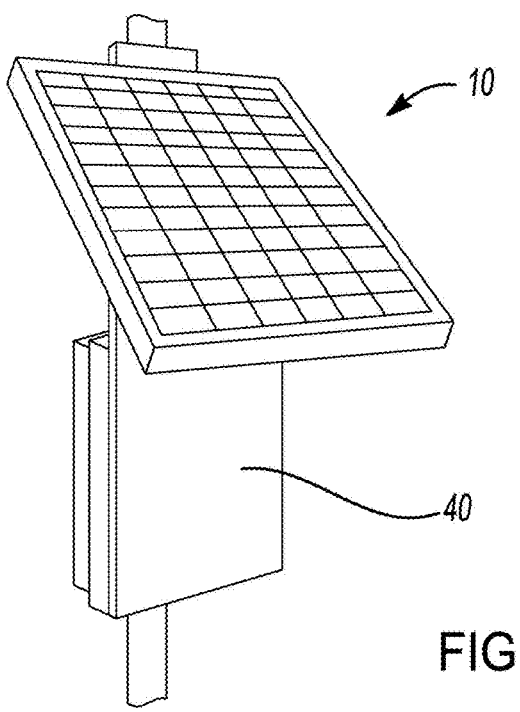
FIG. 8 is a single pole mounted solar panel systems with pole mounted weatherproof enclosure to provide power of 3PCO systems.

The development plan for the power system is to use standard 12V marine batteries and a solar panel scaled for mid-latitude operation. The power budget of the magnetometer, controller, GPS, and communication systems will determine the number of batteries needed designed for "worst-case" winter solar illumination conditions. We will design in margin to ensure continuous operation throughout the year. Unlike traditional magnetometer sites that place the electronics near an AC and environmentally protected structure or building and then extend the magnetometer sensor 50 to 100 m away, the self-contained approach allows more flexibility in deployment (no need to be close to an "isolated" building with power) and no long trenching to bury the sensor cable required. Power protection (fuses) and monitoring of solar panel current and battery charge levels will be part of the low cadence telemetry included with the time stamped 10 Hz magnetometer data package to enable routine system health checks and trouble-shooting diagnostics during the testing and operation phases. Automatic reboot and turn on will be enabled in case of unanticipated power outage when power is restored. A large number of commercial low-cost solar panel systems (panels, mounts, regulators etc.) are available (FIG. 8). The figure is the Tycon RemotePro™ 2.5 W/12V outdoor power systems designed for applications that require a primary off-grid power source to run various electronics. The sealed and weatherproof enclosures have space inside for some of the electronics and the top of the pole can be used to place the GPS antenna.

WiFi and/or cellular modems provide sufficient bandwidth to send data in near real-time. The magnetometer has a data rate of about 24 bytes/sec sampling at 1 Hz (daily data volume of about 2 MB). A USB or Raspberry Pi 4G LTE modem and cellular data plan of 100 MB per month per device is $7-8 from Sprint for Continental US and Canadian customers, with rates reduced based on the number of devices connected. Sampling at higher rates would require getting a monthly data plan that enables 1 GB per month on the order of $35/month. 3PCO will take advantages of data communication advancements and technology being currently deployed and developed for IoT systems (such as low-cost parabolic WiFi antenna that have a range of up to 10 km). As more devices with static IP addresses are connected to the cellular network, the cost per device/per GB of data is decreasing. With the current roll-out of 5G technologies over the three years of this grant, the infrastructure for IoT will be explored and incorporated to enable higher data rate instruments to be connected to the 3PCO system. For many sites the placement of the sensor in proximity to a WiFi hotspot enables either redundancy with the cellular connection or a stand-alone solution. The system is designed to also have a local micro-SD memory card. Memory capacity of several hundred GB are now available for under $10 enabling continuous write to memory for over a year in case of communication system failure as well as grabbing data missed due to temporary communication outages or for sites that have data pulled remotely. Each site will be given a static IP address through the cellular modem and a webpage user interface will be developed to see data and system information real-time. For authorized users access to log onto the device remotely will be possible to change system settings, access directory information, or pull data. We will explore several options to have fully redundant controllers and communication (e.g., WiFi and Cellular or even individual USB cellular modems for each redundant controller). This will provide higher probability of continuous operation and enable connection to the system in the event of a system crash or failure. With the cost and power consumption of controllers, USB or Raspberry Pi cellular modems, and data plans—this individual system redundancy for the low-power magnetometers is possible. Having one system in "stand-by" mode in case of the primary system failure could provide continuous data coverage with the ability for scheduling routine maintenance visits opposed to having long periods of system outages until the system can be visited. In combination of having two systems deployed together, not only will new science opportunities (detection of local noise opposed to identification of transient small-scale ionospheric signals) be enabled, but likelihood of robust continuous operation at each site is significantly increased.

We will also explore developing a Bluetooth Low Energy interface using the Raspberry Pi. This will connect the system to a user's phone or tablet through an APP opportunistically when the device is within about 20 meters of the system. This enables simple diagnostic checks for the local systems using extremely low power and an alternative to connecting the keyboard and monitor stored within the pole mounted electronics box.

The 3PCO system can be "plug-and-play" in that new or additional batteries can be added based on the power needs (additional instruments) and latitude/location specific solar power availability. Sealed marine 12V batteries are relatively inexpensive, reliable, and long-lasting (years). The systems "boxes" will also have standard connectors to make it easy to deploy (not being able to connect the wrong cable to the wrong connector), swap-out sensors (as new versions of the magnetometer are developed, only the small magnetometer box need be dug up and removed), or if the controller, communication system, GPS, batteries or power regulator needs to be accessed the box and modular interface design will enable swapping out individual components or removal of the electronics box without removal of the solar panel, GPS antenna, or sensor.

In some embodiments, a commercial board level dual frequency GPS receiver (such as a Novatel OEM7 series receivers) can be integrated into the system as part of the development path to identify options for electrical interfaces (both power and data) and develop the 3PCO GPS data software routines in the data storage and communication sub-routines. The goal would be to simultaneously take data from the magnetometer and GPS and develop routines to be able to write daily GPS files that can be pushed regularly. Power and data budgets for the 3CPO system will be increased to accommodate this multiple system. The design considerations will include incorporating standard AC power connector and RS232 and USB ports. We will update software with each new iteration of the magnetometer system, so that we have the capability of working with other instrument providers on software integration in the lab and test prior to upgrading any individual system. Though current dual frequency GPS receivers are not low cost (many thousands of dollars) they are relatively low power (the Novatel OEM7 boards consume about 1.3 W in dual frequency mode) making it possible to run both a magnetometer, GPS receiver and communication system with a low-cost power system.

As mentioned previously, a user interface (command line access to the operating system as well as a webpage) will be developed. We will leverage the work done for the MACCS magnetometers that currently run on Raspberry Pi processors and use Adafruit GPS for timing. We are using both of these systems in our V2.0 sensor. We will create our own high level communication protocols to take advantage of modern cellular communication technology and have developed the capability to use the built-in WiFi capabilities of the new Raspberry Pi in our current system.

The main components of the 3PCO system are commercial (power system and WiFi/cellular communication systems) that are coupled with open-source sensor operation software and a data server system with remote web-based access to the sensor and the data. Our development approach will enable the integration of new technologies and software to take advantage of commercial IoT technologies.

Understanding Birkeland currents is a fundamental problem of space physics since Birkeland currents provides information about magnetospheric-ionospheric mapping and coupling processes, energy flow and deposition, and contributes to significant ionospheric and ground-based space weather impacts. Traditionally large-scale Birkeland currents have been mapped statistically from low Earth orbiting spacecraft and the currently operating AMPERE project provides global maps of FAC at 10-minute time cadence by using the fleet of 66 Iridium satellites. These large-scale studies average out much of the small-scale structure that is observed, especially in the auroral zone. Even with high-time resolution single-spacecraft measurements, the FAC signatures are smeared out by the relative motion of the satellite and currents I. Several multi-satellite missions have explored the scale size and structure of FAC including the three spacecraft NASA ST5 and ESA's Swarm missions. ST5 had all three spacecraft in a pearls-on-a-string formation with separations of 350 km, while Swarm has two spacecraft flying side-by-side (just over a degree of separation) and a 3rd flying at a higher altitude and many hours of local time apart (and now a fourth with the inclusion of the Canadian Space Agency e-PoP mission renamed Swarm Echo). The goal of Swarm is to measure both the large-scale geomagnetic and the small-scale lithospheric magnetic fields and the two side-by-side spacecraft allow understanding of small-scale cross-track FAC as well. ST5 was a technology demonstration mission that was turned off after 90-days, while Swarm continues to operate.

A next step in probing the small-scale structure of FAC would be to fly a small constellation of micro-satellites in low-Earth polar orbit to measure the location, amplitude, motion and scale size of small-scale field-aligned currents ideally in combination with densely spaced ground-magnetometer arrays. A proposed mission concept would have four spacecraft flying with two pairs of spacecraft—each pair flying in a pearls-on-a-string orbit, but the two orbital planes separated in the cross track direction (a combination of the ST5 and Swarm orbits. This would enable both along-track and cross-track FAC characterization. The separation along track and in local time would determine the scales accessible, while smaller along-track separation would require higher time resolution measurements. In combination with these space-based data, ground-based magnetometer data provides information about Birkeland currents if the magnetometers have relatively small-scale spacing in both longitude and latitude.

Summary: This study will further design, develop, test and deploy a new low-power magnetometer and a new open-source power and communication system to enable low-cost deployment of magnetometers and other geospace instrumentation at mid and auroral latitudes. The SWM system enables the wide-spread deployment of magnetometers and other instruments by removing some of the barriers of current instrument deployment (needing an isolated building with power and communication; the need to drill holes in the building and to dig 50 to 100 m trenches to bury the sensor cable; and finally significantly lower the cost of commercial or university built magnetometer systems). Using low-cost commercial systems (Raspberry Pi, Adafruit GPS, modified PNI™ magnetometers, solar power and battery systems, USB cellular modems) coupled with falling price of data communication with the advent of the Internet-of-Things enabling systems—the SWM system enables a new way to deploy, maintain and operate magnetometer arrays (redundant systems for reliability, over-sampling, and enabling of new science looking for small-scale transients) and opens the magnetometer ecosystem to a wider community including potentially citizen scientists.

The SWM system exploits development of commercial systems for IoT, solar power generation, and cellular data to make an open-source operating, control and communication system magnetometer observing system that is designed to be expandable to incorporate other low-power geospace instruments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A space weather monitor system comprising:
a power system;
a communication system;
a magnetometer system having a circuit board and four magneto-inductive DC magnetometers, each of the four magneto-inductive DC magnetometers being mounted to an opposing corner of the circuit board;
a computing system operably coupled to the power system, the computing system having a resistance-inductor (RL) circuit having an inductor and a timing system measuring a time necessary to charge and discharge the inductor between an upper and lower threshold, the timing system having a Schmitt trigger oscillator, wherein the time necessary to charge and discharge the inductor is proportional to the inductance that in turn is proportional to a field strength, the computing system outputting a signal via the communication system; and
a plurality of sensors operably coupled to the computing system to refine and correct magnetic measurements, the plurality of sensors comprising inertial sensors configured to provide dynamic information, local weather sensors configured to provide data relating to local weather conditions, temperature sensors, humidity sensors, and a barometric pressure sensor; and
a dual frequency GPS unit configured to provide geolocation, time data, and atmospheric parameters using dual satellite radio signals, the atmospheric parameters including Total Electron Content.

2. The space weather monitor system according to claim 1 wherein the power system comprises a solar system.

3. The space weather monitor system according to claim 1 wherein the power system comprises an AC power system.

4. The space weather monitor system according to claim 1 wherein the power system comprises a battery power system.

5. The space weather monitor system according to claim 1 wherein the communication system comprises a Wi-Fi system.

6. The space weather monitor system according to claim 1 further comprising a remotely located computing system, wherein the communication system comprises an internet communication interface configured to transfer data to the remotely located computing system.

7. The space weather monitor system according to claim 6 wherein the remotely located computing system is a cloud-based system.

8. The space weather monitor system according to claim 7 wherein the cloud-based system is configured to support user queries.

* * * * *